(12) United States Patent
Maeda et al.

(10) Patent No.: US 7,417,372 B2
(45) Date of Patent: Aug. 26, 2008

(54) ORGANIC ELECTROLUMINESCENT DEVICE HAVING INSULATED CONDUCTIVE FILM OVER CATHODE

(75) Inventors: Shoichi Maeda, Kariya (JP); Mitsuharu Muta, Kariya (JP)

(73) Assignee: Kabushiki Kaisha Toyota Jidoshokki, Kariya-Shi (JP)

( * ) Notice: Subject to any disclaimer, the term of this patent is extended or adjusted under 35 U.S.C. 154(b) by 382 days.

(21) Appl. No.: 10/898,448

(22) Filed: Jul. 23, 2004

(65) Prior Publication Data

US 2005/0023970 A1 Feb. 3, 2005

(30) Foreign Application Priority Data

Jul. 29, 2003 (JP) ............................. 2003-203049

(51) Int. Cl.
*H01J 63/04* (2006.01)

(52) U.S. Cl. ...................... 313/506; 313/504; 313/512

(58) Field of Classification Search ................ 313/506, 313/512, 504
See application file for complete search history.

(56) References Cited

U.S. PATENT DOCUMENTS 6,525,339 B2 * 2/2003 Motomatsu .................. 257/40
6,635,988 B1 * 10/2003 Izumizawa et al. .......... 313/504

FOREIGN PATENT DOCUMENTS

| JP | 2003-115393 | 4/2003 |
| JP | 2003-123990 | 4/2003 |

* cited by examiner

*Primary Examiner*—Toan Ton
*Assistant Examiner*—Hana A Sanei
(74) *Attorney, Agent, or Firm*—Morgan & Finnegan, LLP

(57) ABSTRACT

An organic EL device having a large effective area with improved uniformity in luminescent brightness. A transparent first electrode, an organic EL layer, a second electrode, and a protective film are formed on a glass substrate. A conductive film is formed insulated from the second electrode. The conductive film, which covers the second electrode, is connected to opposite ends of the first electrode. One of the ends of the first electrode includes a connection terminal.

12 Claims, 4 Drawing Sheets

ORGANIC ELECTROLUMINESCENT DEVICE HAVING INSULATED CONDUCTIVE FILM OVER CATHODE

BACKGROUND OF THE INVENTION

The present invention relates to organic electroluminescence (EL) devices.

Organic EL devices have received much attention for use as a display device or a thin luminescence device. A typical organic EL device includes a transparent electrode (anode), which is made of indium tin oxide (ITO) and formed on a glass substrate, an organic EL layer, which has a luminescence layer formed on the transparent electrode, and a cathode, which is formed on the organic EL layer. The luminescence layer generates light that is emitted from the glass substrate.

Drive voltage is applied between the anode and the cathode so that current flows through the organic EL layer between the anode and the cathode to emit light from the electroluminescence layer. The intensity of the light emitted from an organic EL device (luminescent brightness) is proportional to the amount of current flowing between the anode and cathode. Further, the resistance of the material forming the transparent electrode is greater than that of the material forming a metal electrode. Accordingly, the electric resistance and electric current differs between a location near an electrode terminal and a location far from an electrode terminal. The difference between the electric currents causes the brightness to differ at different positions in the organic EL device.

Japanese Laid-Open Patent Publication No. 2003-115393 describes a first prior art example in which luminescent brightness differences are suppressed. To reduce the electric resistance of a transparent electrode in the first prior art example, a transparent electrode is used. The transparent electrode has a multilayer structure including a transparent conductive layer and a light-transmissive metal film. The metal film decreases the electric resistance of the transparent electrode and reduces the differences in the luminescent brightness. However, the metal film decreases light transmission in the transparent electrode. This decreases the brightness of the organic EL device.

FIG. 6 shows an organic EL device that suppresses brightness unevenness without decreasing the brightness of the organic EL device. The organic EL device 41 includes a transparent electrode 43, which is formed on a glass substrate 42, and a metal auxiliary electrode 44, which is formed on a peripheral portion of the transparent electrode 43 and connected to an anode. An insulation film 45 is formed on the auxiliary electrode 44. An organic EL layer 46 covers the transparent electrode 43 and the insulation film 45. A cathode 47 is formed on the organic EL layer 46. A protective film 48 is formed on the outer side of the cathode 47 to protect the organic EL layer 46 from oxygen and moisture.

Japanese Laid-Open Patent Publication No. 2003-123990 describes a second prior art example of an organic EL device 54, as shown in FIGS. 7, 8A, and 8B. The organic EL device 54 includes a transparent substrate 50, a transparent anode layer 51, an organic EL layer 52, a cathode layer 53, an insulation layer 55, and an auxiliary electrode layer 56. The transparent anode layer 51 includes an anode electrode terminal 51a. A cathode electrode terminal 53a is defined on the opposite side of the anode electrode terminal 51a. The auxiliary electrode layer 56 includes a contact region 57 that has three sides contacting the transparent anode layer 51 (FIG. 8A) or two sides contacting the transparent anode layer 51 (FIG. 8B).

In the organic EL device 41 of FIG. 6, the organic EL layer 46 is thin. Thus, the organic EL layer 46, which is arranged between the auxiliary electrode 44 and the cathode 47, is apt to being cut by edges of the auxiliary electrode 44. This increases the possibility of the occurrence of short circuiting between the transparent electrode 43 and the cathode 47. Accordingly, the insulation film 45 is requisite and thus increases the manufacturing cost. Further, the arrangement of the auxiliary electrode 44 at the both sides of the luminescent portion increases the area outside the luminescent portion on the glass substrate 42. In other words, the area of the surface of the glass substrate 42 that does not emit light is increased.

In the organic EL device 54 disclosed in Japanese Laid-Open Patent Publication No. 2003-123990, the cathode electrode terminal 53a is arranged on the opposite side of the anode electrode terminal 51a. As shown in FIGS. 7, 8A, and 8B, the auxiliary electrode 56 cannot be connected to the transparent anode layer 51 at the side farthest from the anode electrode 51a. Accordingly, the occurrence of brightness unevenness cannot be sufficiently suppressed. Referring to FIG. 8A, if the auxiliary electrode 56 were to be arranged along three sides of the transparent anode 51, this would increase the area outside the luminescent portion, or the area of the surface of the transparent substrate 50 that does not increase light.

Further, the insulation layer 55 is a requisite to the organic EL device 54 of FIG. 7. This increases the manufacturing cost. Furthermore, although not shown in the drawings, a seal cover or a passivation film is necessary to protect the organic EL layer 52 from oxygen or moisture in the ambient air.

SUMMARY OF THE INVENTION

It is an object of the present invention to provide an organic EL device having a simple structure that minimizes brightness unevenness and decreases the area occupied by portions other than effective luminescent portions on a substrate.

To achieve the above object, the present invention provides an organic electroluminescence device including a substrate for transmitting visible light. A first electrode, arranged on the substrate, transmits visible light. The first electrode has a first end portion, which includes a connection terminal, and a second end portion located opposite to the connection terminal. An organic electroluminescence layer is arranged on the first electrode. Luminescence from the organic electroluminescence layer is emitted out of the electroluminescence device through the substrate. A second electrode is arranged on the organic electroluminescence layer. An insulative protective film, arranged outside of the second electrode, protects the organic electroluminescence layer from at least one of oxygen and moisture. A conductive film is arranged outside of the protective film to cover the second electrode. The conductive film is insulated from the second electrode and includes a first portion connected to the first end portion of the first electrode and a second portion connected to the second end portion of the first electrode.

A further aspect of the present invention is a method for manufacturing an organic electroluminescence device. The method includes arranging a transparent conductive layer on a transparent substrate and partially removing the transparent conductive layer to form a first connection terminal, a second connection terminal, and a transparent first electrode provided with a first end portion and a second end portion. The first and second connection terminals are formed along the first end portion of the first electrode and separated from each other. The method also includes arranging an organic electroluminescence layer on the first electrode, arranging a second electrode on the organic electroluminescence layer, and arranging an insulative protective film on the second electrode for protecting the organic electroluminescence layer from at least one of oxygen and moisture. Further, the method includes arranging a conductive film to cover the protective film so that the conductive film is insulated from the second electrode. The conductive film includes a first portion connected to the first end portion of the first electrode and a second portion connected to the second end portion of the first electrode.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1A:
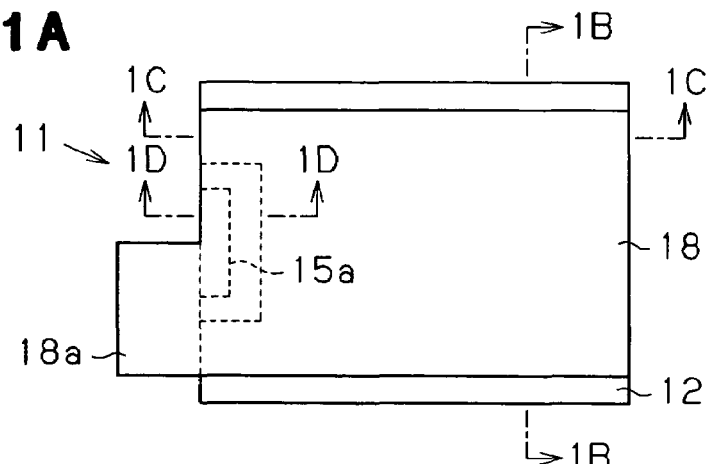
FIG. 1A is a plan view of an organic EL device according to a first embodiment of the present invention.
Figure 1B:
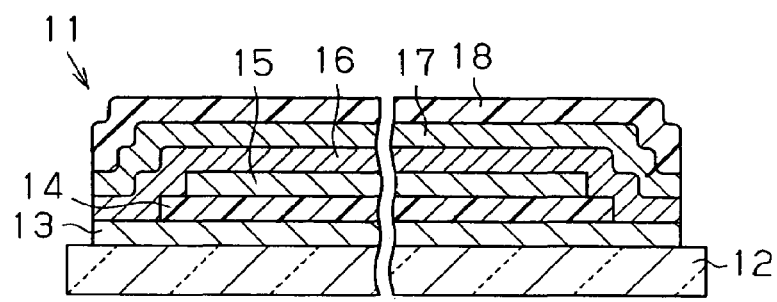
FIG. 1B is a cross-sectional view taken along line 1B-1B in FIG. 1A.
Figure 1C:
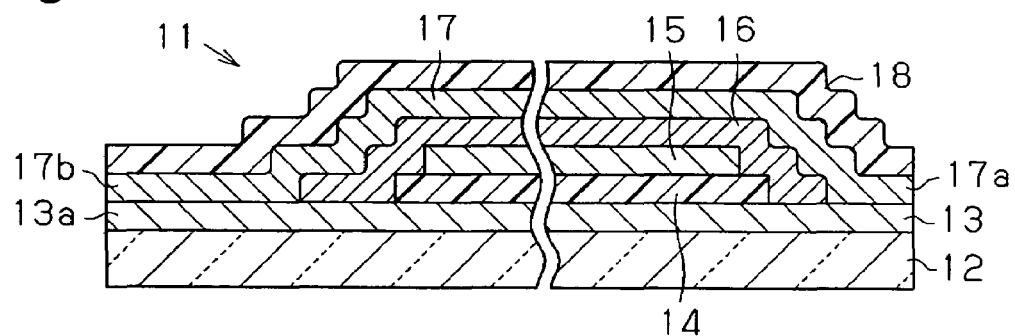
FIG. 1C is a cross-sectional view taken along line 1C-1C in FIG. 1A.
Figure 1D:
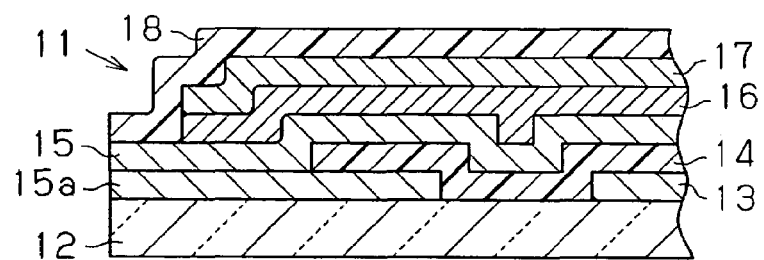
FIG. 1D is a cross-sectional view taken--along line 1D-1D in FIG. 1A.

An organic electroluminescence (EL) device 11 according to a first embodiment of the present invention will now be discussed. The relative dimensions of the parts shown in FIGS. 1 and 2 differ from the actual dimensions.

Referring to FIGS. 1A to 1D, the organic EL device 11 includes a first electrode 13, an organic electroluminescence (EL) layer 14, and a second electrode 15, which are superimposed on a glass substrate 12. The second electrode 15 and the organic EL layer 14 are covered by a protective film 16. The protective film 16 protects the organic EL layer 14 from oxygen and moisture. The glass substrate 12 and the first electrode 13 are transparent and permit the transmission of visible light. The organic EL layer 14 generates light that is emitted from the glass substrate 12. Accordingly, the organic EL device 11 is a so-called bottom emission type device. The first electrode 13 functions as an anode, and the second electrode 15 functions as a cathode. The first electrode 13, the organic EL layer 14, and the second electrode 15 are each flat and rectangular. To prevent short-circuiting between the first electrode 13 and the second electrode 15, the area of the upper surface of the organic EL layer 14 is greater than that of the lower surface of the second electrode 15.

The protective film 16 covers the surfaces of the first electrode 13, the organic EL layer 14, and the second electrode 15 except for the surfaces located between these members.

Figure 2A:
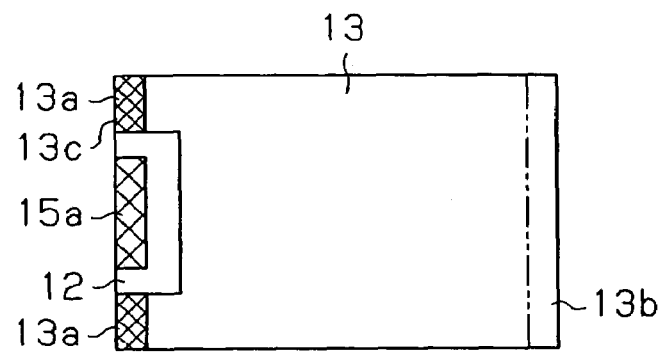
FIG. 2A is a schematic diagram showing the arrangement of a first electrode and a connection terminal.

The first electrode 13 is a transparent electrode including an indium tin oxide (ITO) film. As shown in FIG. 2A, the first electrode 13 has a first end portion 13c, which includes first connection terminals 13a, and a second end portion 13b, which is located on the opposite side of the first connection terminals 13a.

As shown in FIGS. 1 and 2, the organic EL layer 14 may have a structure that is known in the art. For example, from the side closer to the first electrode 13, the organic EL layer 14 may be formed by three superimposed layers, which are a hole injection layer, a luminescence layer, and an electron injection layer, or four layers, which are a hole injection layer, a hole transport layer, a luminescence layer, and an electron transport layer. The organic EL layer 14 emits white light.

A metal that reflects light, such as aluminum or aluminum alloy, may be used as the material for the second electrode 15. The protective film 16 is made of, for example, silicon nitride.

A conductive film 17 covers the second electrode 15 at the outer side of the protective film 16. The conductive film 17 is insulated from the second electrode 15. The conductive film 17 includes a first end portion 17b, which is electrically connected to the first end portion 13c of the first electrode 13, and a second end portion 17a, which is electrically connected to the second end portion 13b of the first electrode 13. The conductive film 17 may be formed integrally with an insulation film 18. In other words, the insulation film 18 may be a multilayer film including an insulation film and a conductive layer, which functions as the conductive film 17. In such a case, the multilayer film (the insulation film 18) is applied to the protective film 16 such that the conductive film (the conductive layer 17) faces towards the protective film 16.

The conductive film 17 is made of a material having resistivity that is smaller than that of the first electrode 13. The insulation film 18 is, for example, a polyimide film, and the conductive film 17 is, for example, a metal foil (e.g., copper foil). The conductive film 17 may be adhered to the insulation film 18. The conductive film 17 is connected to the first electrode 13 only at the first end portion 17b and the second end portion 17a.

FIG. 2A shows the arrangement of the first electrode 13, the first connection terminals 13a, and a second connection terminal 15a, which is to be connected to the second electrode 15. The first electrode 13, the first connection terminals 13a, and the second connection terminal 15a are formed by patterning a transparent conductive layer, which is made of a material such as ITO and formed on the substrate 12, and then eliminating parts of the transparent conductive layer. As shown in FIG. 2A, the first connection terminals 13a, which is indicated by meshed portions, is formed continuously from the first electrode 13. The second connection terminal 15a is separated from the first connection terminals 13a and the first electrode 13.

As shown in FIG. 1A, the insulation film 18 is formed by a rectangular portion, which has a size corresponding to the first electrode 13 including the connection terminals 13a and 15a, and a terminal formation portion 18a, which extends from the rectangular portion. The terminal formation portion 18a provides regions for forming terminals (or pads) to be connected to a drive circuit (not shown) that drives the organic EL device 11.

Figure 2B:
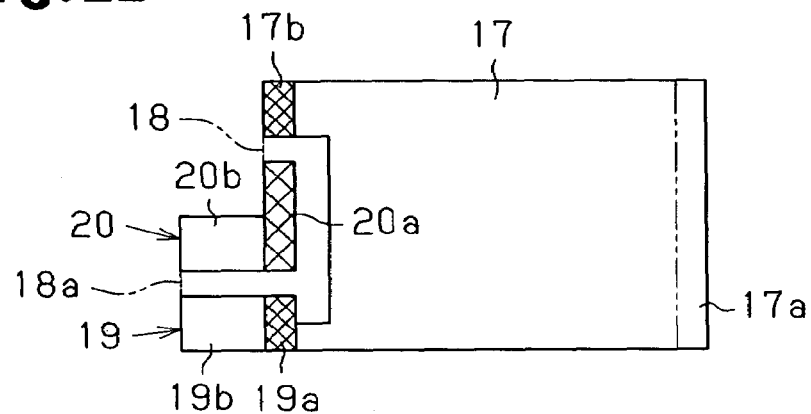
FIG. 2B is a schematic diagram showing the relationship between a conductive film and a metal film.

FIG. 2B shows the arrangement of the conductive film 17, and metal films 19 and 20. The conductive film 17, the first metal film 19 and the second metal film 20 are formed on the insulation film 18. The first metal film 19 is formed continuously from the conductive film 17.

The metal films 19 and 20 are each formed from copper foils. The first metal film 19 includes a contact region 19a, which is located on the side closer to the first end portion 17b of the conductive film 17 and electrically connected to the first connection terminals 13a. The second metal film 20 includes a contact region 20a, which is located on the side closer to the first end portion 17b of the conductive film 17 and electrically connected to the connection terminal 15a. The pads 19b and 20b respectively function as first and second external terminals for connecting the first and second electrodes 13 and 15 to external lines that lead to the drive circuit.

The insulation film 18 is connected to the glass substrate 12 using, for example, an anisotropic conductive film (ACF), so that the second end portion 17a of the conductive film 17 is arranged in correspondence with the second end portion 13b of the first electrode 13 on the opposite side of the first connection terminals 13a and so that the first end portion 17b is arranged in correspondence with the first connection terminals 13a (the upper connection terminal 13a as viewed in FIG. 2A). Accordingly, the terminal formation portion 18a projects from the glass substrate 12.

The operation of the organic EL device 11 will now be discussed. The organic EL device 11 is used, for example, as a backlight for a liquid crystal display.

When using the organic EL device 11, the pads 19b and 20b of the first and second metal films 19 and 20 formed on the insulation film 18 are connected to external lines that lead to the drive circuit for driving the organic EL device 11 by an anisotropic conductive film (ACF) or a connector.

The drive circuit supplies current to the first electrode 13 via the pad 19b from the first connection terminal 13a, which is connected to the contact region 19a of the first metal film 19. Further, the first metal film 19 supplies current to the first electrode 13 from the second end portion 13b, which is located on the opposite side of the first connection terminals 13a.

The resistivity of the material forming the first electrode 13 (transparent electrode) is greater than that of metal having relatively high conductivity, such as aluminum and copper. Thus, when current is supplied to the first end of the first electrode 13 only from the first connection terminals 13a, a large amount of current tends to flow from the first electrode 13 to the second electrode 15 through the organic EL layer 14 near the first connection terminals 13a. However, at portions separated from the first connection terminals 13a, the amount of current flowing from the first electrode 13 to the second electrode 15 tends to be small. As a result, brightness unevenness would occur in the organic EL device 11. To solve this problem, in the present embodiment, the conductive film 17, which has relatively high conductivity, is connected to the first connection terminals 13a and the second end portion 13b of the first electrode 13 located on the opposite side of the first connection terminals 13a. Thus, the difference between the amount of current flowing through the organic EL layer 14 near the first connection terminals 13a and the amount of current flowing through the organic EL layer 14 at a location farthest from the first connection terminals 13a is small. This minimizes brightness unevenness in the organic EL device 11. Further, the conductive film 17, which covers the organic EL layer 14, uniformly radiates the heat of the organic EL layer 14 and improves the brightness unevenness minimizing effect.

The conductive film 17 functions to supply current to different portions of the first electrode 13. Thus, the conductive film 17 must be insulated from the second electrode 15. The conductive film 17 is located at the outer side of the protective film 16, which is located between the conductive film 17 and the second electrode 15. Thus, the conductive film 17 and the second electrode 15 are insulated from each other.

The first embodiment has the advantages described below.

(1) The first electrode 13, the organic electroluminescence layer 14, and the second electrode 15 are formed on the substrate in order of mention. The insulative protective film 16 for protecting the organic electroluminescence layer from oxygen and moisture is arranged outside of the second electrode 15. The conductive film 17, which is insulated from the second electrode 15 at the outer side of the protective film 16, is connected to the first end portion 13c and second end portion 13b of the first electrode 13. Accordingly, unlike the prior art, an exclusive insulation film for ensuring insulation between the conductive film 17 and the second electrode 15 is not necessary. This decreases the manufacturing cost. Further, the small difference between the amount of current flowing through the organic EL layer 14 at portions close to the first connection terminals 13a of the first electrode 13 and at portions far from the first connection terminals 13a minimizes brightness unevenness in the entire organic EL device 11. Additionally, since the conductive film 17 covers the organic EL layer 14, the heat produced in the organic EL layer 14 is uniformly radiated. This improves the brightness unevenness minimizing effect. Also, the conductive film 17 does not have to be connected to one or more sides that are adjacent to the side including the first connection terminal 13a in the first electrode 13, and an auxiliary electrode is not necessary. Therefore, the area of the substrate 12 from which light is not emitted is relatively small. As a result, the effective luminescent portion has a relatively large area. The term "an effective luminescent portion" refers to a surface area of the substrate 12 through which light is emitted.

(2) The conductive film 17 is connected to the first electrode 13 only at the first end portion 13c, which includes the first connection terminals 13a, and the second end portion 13b, which is located on the opposite side of the first connection terminals 13a. Accordingly, the conductive film 17 does not have to be connected to the first electrode 13 on a side adjacent to the side connected to the first connection terminals 13a. This decreases the area of non-luminescent portions without affecting the effective luminescent area and enables the organic EL device 11 to be manufactured more compact.

(3) The conductive film 17 is covered by the insulation film 18 and faces towards the protective film 16. This prevents short-circuiting that may occur if the conductive film 17 comes into contact with electronic components when attaching the organic EL device 11 to a frame.

(4) The metal films 19 and 20, which function as terminals connected to external lines, are formed on the terminal formation portion 18a of the insulation film 18. The first metal film 19 is formed continuously from the conductive film 17. The insulation film 18, which is formed integrally with the conductive film 17, is adhered to the glass substrate 12, on which the first electrode 13 and the second electrode 15 are formed, so that the first electrode 13 and the second electrode 15 are connected to the external lines. This facilitates the manufacturing of the organic EL device 11 without having to provide separate connection terminals for the first electrode 13 and the second electrode 15.

(5) The conductive film 17, which is made of a metal foil, may be adhered to the insulation film 18 by cutting the metal foil into predetermined shapes beforehand. This shortens the manufacturing time in comparison with when forming the conductive film 17 through vapor deposition or plating.

(6) The second electrode 15 is made of metal to reflect light. Thus, some of the light of the organic EL layer 14 is reflected by the second electrode 15 and emitted from the glass substrate 12. Accordingly, in comparison to when the second electrode 15 is not reflective, the amount of light emitted from the glass substrate 12 is increased.

(7) The conductive film 17 is a metal film and functions as a passivation film that prevents the entry of oxygen and moisture in the ambient air from entering the organic EL device 11.

(8) The area of the upper surface of the organic EL layer 14 is greater than the area of the lower surface of the second electrode 15. Since the area of the upper surface of the organic EL layer 14 and the area of the lower surface of the second electrode 15 are not the same, short-circuiting between the first electrode 13 and the second electrode 15 is easily prevented.

Figure 3:
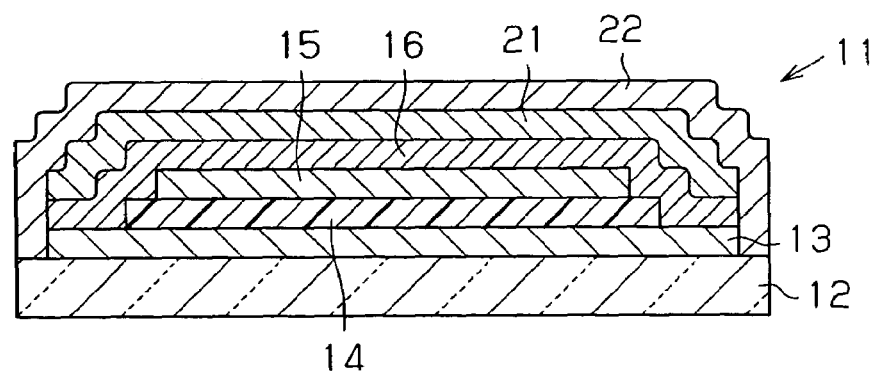
FIG. 3 is a cross-sectional view of an organic EL device according to a second embodiment of the present invention.

An organic EL device 11 according to a second embodiment of the present invention will now be discussed centering on parts differing from the first embodiment. FIG. 3 is a cross-sectional view corresponding to FIG. 1B. The main difference of the second embodiment from the first embodiment is in a conductive film 21 and an insulation film 22. In FIG. 3, elements that are identical to those of the first embodiment are denoted with the same numerals and will not be described in detail.

Referring to FIG. 3, the conductive film 21 is formed by depositing metal, such as aluminum, on the protective film 16. The conductive film 21 is large enough to cover the second electrode 15. The conductive film 21 includes a first end portion, which is connected to the first electrode 13 at the first end portion 13c that includes the first connection terminals 13a, and a second end portion, which is connected to the first electrode 13 at the second end portion 13b. The conductive film 21 is connected to the first electrode 13 only at the first end portion 13c and the second end portion 13b.

The insulation film 22, which is made of the same material as the protective film 16, covers the conductive film 21. The insulation film 22 is made of, for example, silicon nitride. The organic EL device 11 of the second embodiment is formed by sequentially superimposing the first electrode 13, the organic EL layer 14, the second electrode 15, the protective film 16, the conductive film 21, and the insulation film 22 on the glass substrate 12 under a vacuum environment. Particularly, the protective film 16 and the insulation film 22 are formed in the same processing chamber.

In the second embodiment, an external line connection terminal cannot be formed on the insulation film 18. Instead, an external line for the first electrode 13 is connected to the conductive film 21, which is superimposed on the first connection terminals 13a, by an ACF. Alternatively, the first connection terminals 13a may be formed with a relatively large size so that the conductive film 21 does not overlap portions of contact between the first connection terminals 13a and an external line. An external line for the second electrode 15 is connected to an end portion of the second electrode 15 superimposed on the connection terminal 15a for the second electrode 15 by an ACF.

In addition to advantages (1), (2), (6), (7), and (8) of the first embodiment, the second embodiment has the advantages described below.

(9) The conductive film 21 is formed on the protective film 16 by performing vapor deposition. Accordingly, in comparison to when adhering a metal foil as the conductive film 17 on the protective film 16, the adhesion between the conductive film 21 and the protective film 16 is improved. This uniformly radiates the heat produced from the organic EL layer 14 and uniforms the luminescent brightness.

(10) The conductive film 21 is made of aluminum, which can easily be vapor-deposited. Thus, manufacturing is facilitated in comparison to when using other metals, such as copper.

(11) The insulation film 22, which is made of the same material as the protective film 16, covers the conductive film 21. This prevents short-circuiting that may occur if the conductive film 21 comes into contact with electronic components when attaching the organic EL device 11 to a frame. Further, since the insulation film 22 is made of the same material as the protective film 16, formation of the insulation film 22 by performing the same process as the protective film 16, for example, by performing chemical vapor deposition (CVD), would enable the insulation film 22 to be thinner than the insulation film 18 in the first embodiment. This would enable the organic EL device 11 to have a thinner dimension. When performing vapor deposition to form the insulation film 22, the protective film 16 and the insulation film 22 may be formed in the same chamber. Further, even if the protective film 16 and the insulation film 22 are thin, moisture and oxygen are prevented from entering the organic EL device 11. In addition, this would enable the manufacturing of a thin organic EL device 11 and reduce the time for forming the protective film 16.

It should be apparent to those skilled in the art that the present invention may be embodied in many other specific forms without departing from the spirit or scope of the invention. Particularly, it should be understood that the present invention may be embodied in the following forms.

Figure 4:
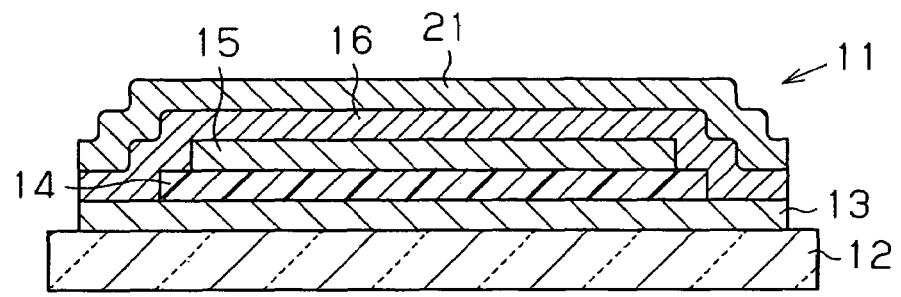
FIG. 4 is a cross-sectional view of an organic EL device according to another embodiment of the present invention.

The insulation film 18 or 22 may be eliminated. For example, referring to FIG. 4, the conductive film 21 may be vapor-deposited on the protective film 16. Alternatively, a metal foil may be adhered on the protective film 16 to function as the conductive film 21.

The protective film 16 does not have to be made of silicon nitride. A material having little transmissivity with respect to moisture or gases, such as silicon oxide (SiOx) or diamond-like carbon (DLC), may be used to form the protective film 16. Further, the protective film 16 may be formed by superimposing thin films made of different materials.

Instead of performing vapor-deposition to form the protective film 16, the protective film 16 may be a coated film. For example, the protective film 16 may be a coating of polysilazane.

The surface of the conductive film 17 may be smooth. Alternatively, the surface of the conductive film 17 may be rough. For example, embossment may be performed on the insulation film 18, which is formed integrally with the conductive film 17, to form projections and recesses in the conductive film 17. Alternatively, a conductive film 17 that includes projections and recesses may be used with a flat insulation film 18. The projections and recesses increase the surface area of the conductive film 17 and effectively release heat from the organic EL layer 14. This minimizes brightness unevenness in the organic EL device 11.

The first electrode 13 formed on the glass substrate 12 may function as a cathode, and the second electrode 15 may function as an anode. In this case, the structure of the organic EL layer 14 is changed accordingly. For example, the organic EL layer 14 may include from the side closer to the first electrode 13, the three layers of an electron injection layer, a luminescence layer, and a hole injection layer. Alternatively, the organic EL layer 14 may include from the side closer to the first electrode 13, the five layers of an electron injection layer, an electron transport layer, a luminescence layer, a hole transport layer, and a hole injection layer.

The organic EL layer 14 may be formed from a single luminescence layer. Alternatively, the organic EL layer 14 may be formed from a plurality of layers by superimposing on a luminescence layer one or more of a hole injection layer, a hole transport layer, a hole injection transport layer, a hole restriction layer, an electron injection layer, an electron transport layer, and an electron restriction layer.

Figure 5:
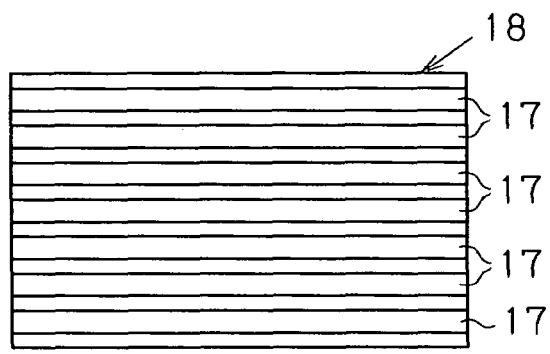
FIG. 5 is a schematic view showing an organic EL device according to a further embodiment of the present invention.
Figure 6:
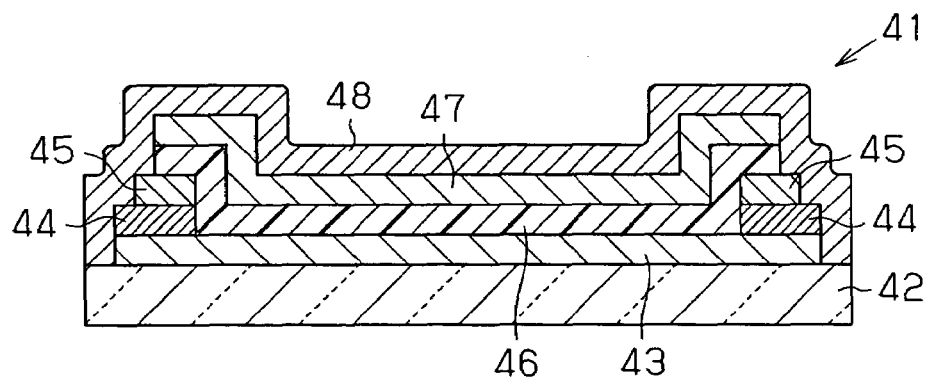
FIG. 6 is a cross-sectional diagram showing a prior art organic EL device.
Figure 7:
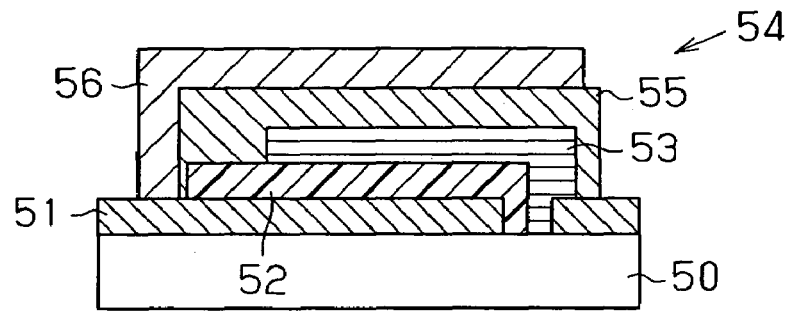
FIG. 7 is a cross-sectional diagram showing another prior art example of an organic EL device.
Figure 8A:
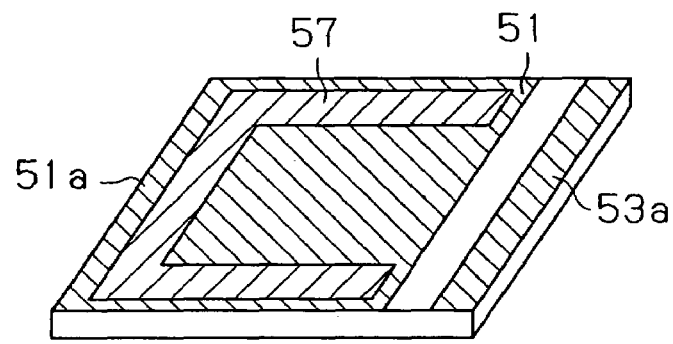
FIGS. 8A and 8B are perspective views showing a contact region defined between an auxiliary electrode and a transparent anode layer.
Figure 8B:
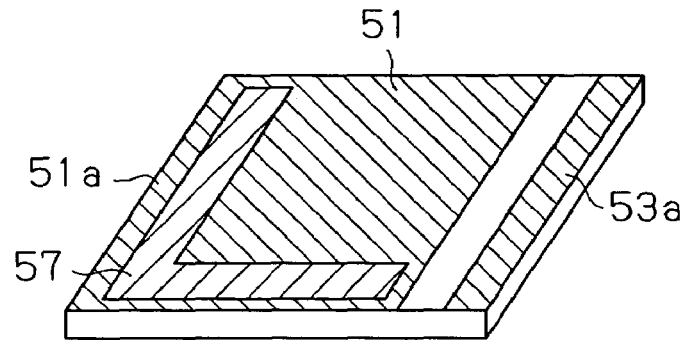

The organic EL device 11 does not have to be used as a backlight and may be used as another type of lighting device, a light source for a display device, or as an EL display device. For example, when using the organic EL device 11 in a display device driven in compliance with the passive matrix technique, the first electrode 13 may be one of a plurality of parallel strips of electrodes formed on the surface of the glass substrate 12. In this case, the organic EL layer 14 includes a plurality of parallel strip-like sections extending in a direction intersecting the strips of electrodes. A single second electrode 15 is superimposed on the organic EL layer 14. The intersections of the first electrodes 13 and the second electrode 15 function as pixels or sub-pixels that are arranged in a matrix. Referring to FIG. 5, strips of conductive films 17, each associated with one of the first electrodes 13, are formed on the insulation film 18. The insulation film 18 is adhered to the glass substrate 12 so that a first end portion, which includes a connection terminal 13a, of each first electrode 13 is connected to part of an associated one of the strips of conductive films 17 and so that a second end portion 13b of each first electrode 13 is connected to another part of the associated one of the strips of conductive films 17.

The conductive film 17 does not have to be a metal foil that is adhered to the insulation film 18. For example, the conductive film 17 does not have to be performed through vapor deposition or plating. Vapor deposition or plating is not effective when a plurality of conductive films 17 are formed on the insulation film 18 (i.e., when manufacturing a display device complying with the passive matrix technique).

When forming a plurality of conductive films 17 without using the insulation film 18, strips of conductive films 17 are vapor-deposited on the protective film 16 and the insulation film 22 is vapor-deposited thereon.

The second connection terminal 15a of the second electrode 15 does not have to be arranged on the same peripheral edge portion (the first end portion 13c) of the glass substrate 12 as the first connection terminals 13a of the first electrode 13. For example, the second connection terminal 15a may be arranged on one peripheral edge portion of the glass substrate 12 that is adjacent to the first connection terminals 13a.

The first end portion 17b of the conductive film 17 may be connected to the vicinity of the first connection terminals 13a of the first electrode 13.

When the organic EL device 11 is used for a display device, the substrate may be formed by superimposing color filters on a transparent substrate.

A transparent resin substrate may be used in lieu of the glass substrate 12. The resin substrate may be flexible. A resin substrate is advantageous when reducing the weight of the organic EL device 11.

The conductive film 17 may be connected to a square, first electrode 13 at a first side, at which the connection terminals 13a are located, a second side located on the opposite side of the connection terminals 13a, and the sides adjacent to the first connection terminals 13a. This further reduces brightness unevenness.

The second electrode 15 does not have to reflect visible light. However, when the second electrode 15 is reflective, light from the organic EL layer 14 is reflected by the second electrode 15 and emitted out of the glass substrate 12. Thus, in comparison to when the second electrode 15 does not reflect light, a greater amount of light is emitted from the glass substrate 12. Accordingly, the necessary amount of light may be obtained even when the amount of light emitted from the organic EL layer 14 is decreased. This reduces power consumption.

Metals other than aluminum may be used to form the second electrode 15. For example, Au, Ag, Cu, Cr, or In may be used to form the second electrode 15. A metal film formed from Au or Cr resists oxidation and improves durability.

The material of the transparent electrode is not limited to ITO. For example, zinc oxide may be used in lieu of ITO.

The present examples and embodiments are to be considered as illustrative and not restrictive, and the invention is not to be limited to the details given herein, but may be modified within the scope and equivalence of the appended claims.

What is claimed is:

1. An organic electroluminescence device comprising:
    a substrate for transmitting visible light;
    a first electrode, arranged on the substrate, for transmitting visible light, the first electrode having a first end portion, which includes a connection terminal, and a second end portion located opposite to the connection terminal;
    an organic electroluminescence layer arranged on the first electrode, wherein luminescence from the organic electroluminescence layer is emitted out of the electroluminescence device through the substrate;
    a second electrode arranged on the organic electroluminescence layer;
    an insulative protective film, arranged outside of the second electrode, for protecting the organic electroluminescence layer from at least one of oxygen and moisture; and
    a conductive film arranged outside of the insulative protective film to cover the second electrode, the conductive film being insulated from the second electrode and including a first portion electrically connected to the first end portion of the first electrode and a second portion electrically connected to the second end portion of the first electrode,
    wherein the conductive film has a surface including at least one of a plurality of projections and a plurality of recesses.

2. The organic electroluminescent device according to claim 1, wherein the conductive film is connected to the first electrode only at the first portion and the second portion.

3. The organic electroluminescent device according to claim 1, further comprising:
    an insulation film formed integrally with the conductive film with the conductive film facing towards the protective film.

4. The organic electroluminescence device according to claim 3, further comprising:
    a first metal film formed on the insulation film continuously from the conductive film; and
    a second metal film formed on the insulation film, the first metal film including a first external terminal for connecting the first electrode to an external line, and the second metal film including a second external terminal for connecting the second electrode to an external line.

5. The organic electroluminescent device according to claim 1, wherein the conductive film is a metal foil.

6. The organic electroluminescence device according to claim 1, wherein the conductive film is a vapor deposition film or a plating film.

7. The organic electroluminescence device according to claim 1, wherein the conductive film is a vapor deposition film formed on the insulative protective film.

8. The organic electroluminescence device according to claim 7, wherein the insulative protective film is made of aluminum.

9. The organic electroluminescence device according to claim 7, further comprising:
   an insulation film covering the conductive film and made of a material that is the same as that of the insulative protective film.

10. The organic electroluminescence device according to claim 1, further comprising:
    a peripheral edge portion outside of the first electrode;
    a first connection terminal connected to the first electrode; and
    a second connection terminal connected to the second electrode, the first connection terminal and the second connection terminal being formed on said peripheral edge portion.

11. The organic electroluminescence device according to claim 1, wherein the electroluminescence layer has a surface with an area that is greater than that of a surface of the second electrode.

12. The organic electroluminescence device according to claim 1, wherein the electroluminescence device is used as a backlight for a liquid crystal display.

* * * * *

UNITED STATES PATENT AND TRADEMARK OFFICE
CERTIFICATE OF CORRECTION

PATENT NO. : 7,417,372 B2  
APPLICATION NO. : 10/898448  
DATED : August 26, 2008  
INVENTOR(S) : Shoichi Maeda et al.

It is certified that error appears in the above-identified patent and that said Letters Patent is hereby corrected as shown below:

Column 1, lines 7-8, please delete "organic electroluminescence (EL) devices." and insert therefore -- organic electroluminescent (EL) devices. --;

Column 1, line 10, please delete "thin luminescence device" and insert therefore -- thin luminescent device --;

Column 1, line 12, please delete "indium tin oxide" and insert therefore -- indium-tin-oxide --;

Column 2, lines 39, 46-47 and 58, please delete "electroluminescence device" and insert therefore -- electroluminescent device --;

Column 3, line 28, please delete "taken--along" and insert therefore -- taken along --;

Column 3, line 51, please delete "electroluminescence (EL) device" and insert therefore -- electroluminescent (EL) device --;

Column 4, line 10, please delete "indium tin oxide" and insert therefore -- indium-tin-oxide --;

Column 4, lines 58-59, please delete "terminals 13a, which is indicated" and insert therefore -- terminals 13a, which are indicated --;

Column 4, line 59, please delete "is formed" and insert therefore -- are formed --; and Column 8, lines 6-7, please delete "EL layer 14 and uniforms the luminescent brightness." and insert therefore -- EL layer 14 and makes the luminescent brightness uniform. --.

In Claim 1, column 10, lines 25 and 33-34, please delete "electroluminescence device" and insert therefore -- electroluminescent device --;

In Claim 4, column 10, line 59, please delete "electroluminescence device" and insert therefore -- electroluminescent device --;

In Claim 6, column 11, line 3, please delete "electroluminescence device" and insert therefore -- electroluminescent device --;

UNITED STATES PATENT AND TRADEMARK OFFICE
CERTIFICATE OF CORRECTION

PATENT NO. : 7,417,372 B2
APPLICATION NO. : 10/898448
DATED : August 26, 2008
INVENTOR(S) : Shoichi Maeda et al.

It is certified that error appears in the above-identified patent and that said Letters Patent is hereby corrected as shown below:

In Claim 7, column 11, line 6, please delete "electroluminescence device" and insert therefore -- electroluminescent device --;

In Claim 8, column 11, line 10, please delete "electroluminescence device" and insert therefore -- electroluminescent device --;

In Claim 9, column 11, line 13, please delete "electroluminescence device" and insert therefore -- electroluminescent device --;

In Claim 10, column 12, line 1, please delete "electroluminescence device" and insert therefore -- electroluminescent device --;

In Claim 11, column 12, line 10, please delete "electroluminescence device" and insert therefore -- electroluminescent device --; and In Claim 12, column 12, lines 14 and 15, please delete "electroluminescence device" and insert therefore -- electroluminescent device --.

Signed and Sealed this

Seventh Day of July, 2009

JOHN DOLL
*Acting Director of the United States Patent and Trademark Office*